(12) United States Patent
Kim et al.

(10) Patent No.: US 11,164,805 B2
(45) Date of Patent: Nov. 2, 2021

(54) SEMICONDUCTOR PACKAGE INCLUDING NON-CONDUCTIVE FILM BETWEEN PACKAGE SUBSTRATE AND SEMICONDUCTOR CHIP THEREON

(71) Applicant: Samsung Electronics Co., Ltd., Suwon-si (KR)

(72) Inventors: Younglyong Kim, Anyang-si (KR); Taewon Yoo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/814,455

(22) Filed: Mar. 10, 2020

(65) Prior Publication Data

US 2021/0066148 A1 Mar. 4, 2021

(30) Foreign Application Priority Data

Aug. 26, 2019 (KR) .................. 10-2019-0104579

(51) Int. Cl.
*H01L 23/31* (2006.01)
*H01L 23/29* (2006.01)
*H01L 23/00* (2006.01)

(52) U.S. Cl.
CPC .......... *H01L 23/3128* (2013.01); *H01L 23/29* (2013.01); *H01L 23/3114* (2013.01); *H01L 24/13* (2013.01)

(58) Field of Classification Search
CPC combination set(s) only.
See application file for complete search history.

(56) References Cited

U.S. PATENT DOCUMENTS 6,534,858 B2   3/2003   Akram et al.
7,635,912 B2   12/2009  Ejima
(Continued)

FOREIGN PATENT DOCUMENTS

KR   10-1374146   1/2014
KR   10-1680428   4/2016

OTHER PUBLICATIONS

F.X. Che, et al. "Stress Analysis and Design Optimization for Low-k Chip With Cu Pillar Interconnection," Institute of Microelectronics, AStar (Agency for Science, Technology and Research) (2015) pp. 1-11.
(Continued)

*Primary Examiner* — Mamadou L Diallo
(74) *Attorney, Agent, or Firm* — Harness, Dickey & Pierce, P.L.C.

(57) ABSTRACT

A semiconductor package including a package substrate, a semiconductor chip on a top surface of the package substrate, a connection terminal between the package substrate and the semiconductor chip, the connection terminal connecting the package substrate to the semiconductor chip, a non-conductive film (NCF) between the package substrate and semiconductor chip, the NCF surrounding the connection terminal and bonding the semiconductor chip to the package substrate, and a side encapsulation material covering a side surface of the semiconductor chip, contacting the package substrate, and including a first portion between a bottom surface of the semiconductor chip and the top surface of the package substrate may be provided. At least a portion of the NCF includes a second portion that horizontally protrudes from the semiconductor chip when viewed, and a portion of the side encapsulation material is in contact with the bottom surface of the semiconductor chip.

20 Claims, 19 Drawing Sheets

(56) References Cited

U.S. PATENT DOCUMENTS

| | | | |
|---|---|---|---|
| 7,973,310 B2 | 7/2011 | Wang et al. | |
| 8,044,154 B2 | 10/2011 | McNamara et al. | |
| 8,084,553 B2 | 12/2011 | Liang et al. | |
| 8,637,350 B2 | 1/2014 | Ahn et al. | |
| 8,816,509 B2 | 8/2014 | Hong et al. | |
| 9,136,260 B2 | 9/2015 | Ahn et al. | |
| 9,209,156 B2 | 12/2015 | Len et al. | |
| 9,368,374 B2 | 6/2016 | Hamazaki et al. | |
| 9,461,029 B2* | 10/2016 | Jang | H01L 25/0657 |
| 9,583,420 B2 | 2/2017 | Lin et al. | |
| 10,153,255 B2* | 12/2018 | Hwang | H01L 24/92 |
| 10,211,176 B2 | 2/2019 | Jang et al. | |
| 10,600,708 B2* | 3/2020 | Tsai | H01L 24/16 |
| 2006/0237843 A1* | 10/2006 | Yanaka | H01L 23/49816 257/738 |
| 2008/0041615 A1* | 2/2008 | Zhong | H05K 3/285 174/255 |
| 2012/0171814 A1* | 7/2012 | Choi | H01L 23/3128 438/107 |
| 2013/0295381 A1 | 11/2013 | Ying et al. | |
| 2014/0151867 A1 | 6/2014 | Lin et al. | |
| 2014/0191396 A1 | 7/2014 | Lin et al. | |
| 2015/0041980 A1 | 2/2015 | Ahn et al. | |
| 2015/0061104 A1* | 3/2015 | Takahashi | H01L 23/544 257/704 |
| 2015/0130083 A1* | 5/2015 | Park | H01L 23/36 257/777 |
| 2015/0140738 A1* | 5/2015 | Moriyama | H01L 24/83 438/113 |
| 2015/0162265 A1* | 6/2015 | Jo | H01L 24/97 257/774 |
| 2015/0347806 A1 | 12/2015 | Li et al. | |
| 2016/0307861 A1 | 10/2016 | Lin et al. | |
| 2018/0068958 A1* | 3/2018 | Cho | H01L 23/481 |
| 2019/0096856 A1 | 3/2019 | Hwang et al. | |

OTHER PUBLICATIONS

Charlie Jun Zhai, et al. "Investigation and Minimization of Underfill Delamination in Flip Chip Packages," IEEE Transactions on Device and Materials Reliability, vol. 4, No. 1 (2004), pp. 86-91.

* cited by examiner

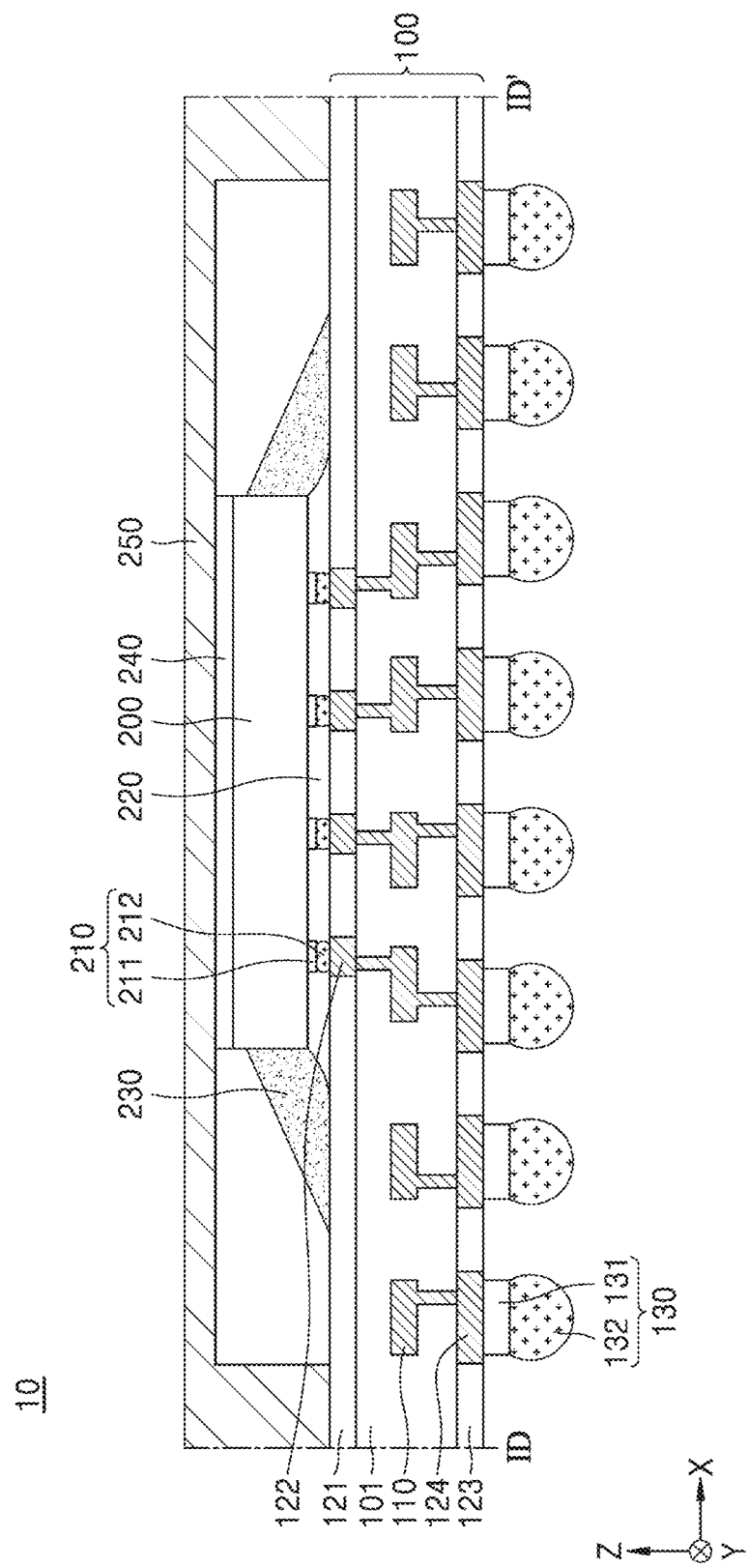

SEMICONDUCTOR PACKAGE INCLUDING NON-CONDUCTIVE FILM BETWEEN PACKAGE SUBSTRATE AND SEMICONDUCTOR CHIP THEREON

CROSS-REFERENCE TO RELATED APPLICATION

This application claims priority under 35 U.S.C. § 119 to Korean Patent Application No. 10-2019-0104579, filed on Aug. 26, 2019, in the Korean Intellectual Property Office, the disclosure of which is incorporated herein in its entirety by reference.

BACKGROUND

The inventive concepts relate to semiconductor packages. More particularly, the inventive concepts relate to semiconductor packages manufactured using a thermo-compression process using a non-conductive film (NCF).

With the development of techniques, materials, and manufacturing processes, computing power and wireless communication capabilities have been rapidly advanced for several decades. Accordingly, highly-integrated high-performance transistors have been realized, and the degree of integration has doubled about every 18 months according to Moore's Law. Realization of smaller and lighter systems having power efficiency has been a continuing goal of the semiconductor industry. When the existing processes appears to reach economic and/or physical limits, three-dimensional (3D) integrated packaging has been suggested as an effective solution.

3D integrated devices started to be developed beginning with complementary metal-oxide semiconductor (CMOS) devices introduced in 1980 and have advanced through continuous research and development for about 30 years afterwards. 3D integration technology includes, for example, integration of logic circuits and memory circuits, sensor packaging, and hetero-integration of micro-electro-mechanical systems (MEMS) and CMOS. 3D integration technology may accomplish a reduced form factor, higher reliability, lower power consumption, and/or relatively low manufacturing cost.

SUMMARY

The inventive concepts provide semiconductor packages having enhanced reliability and/or methods of manufacturing the same.

The inventive concepts are not limited to what is mentioned above and will be clearly understood by those skilled in the art from the descriptions below.

According to an example embodiment of the inventive concepts, a semiconductor package includes package substrate, a semiconductor chip on a top surface of the package substrate, a connection terminal between the package substrate and the semiconductor chip, the connection terminal connecting the package substrate to the semiconductor chip, a non-conductive film (NCF) between the package substrate and the semiconductor chip, the NCF surrounding the connection terminal and bonding the semiconductor chip to the package substrate, and a side encapsulation material covering a side surface of the semiconductor chip, contacting the package substrate, and including a first portion between a bottom surface of the semiconductor chip and the top surface of the package substrate. At least a portion of the NCF includes a second portion that horizontally protrudes from the semiconductor chip when viewed from above, and a portion of the side encapsulation material is in contact with the bottom surface of the semiconductor chip.

According to an example embodiment of the inventive concepts, a semiconductor package includes a printed circuit board including a substrate base, a first pad on a top surface of the substrate base, a first resist layer covering the top surface of the substrate base and exposing at least a portion of the first pad, a second pad on a bottom surface of the substrate base, and a second resist layer covering the bottom surface of the substrate base and exposing at least a portion of the second pad, a semiconductor chip on a top surface of the printed circuit board, the semiconductor chip having a quadrangular shape from top view, a connection terminal between the printed circuit board and the semiconductor chip, the connection terminal including a first under bump metallurgy (UBM) layer contacting the first pad and a first solder contacting the first UBM layer, an external connection terminal including a second UBM layer contacting the second pad and a second solder contacting the second UBM layer, the external connection terminal being larger than the connection terminal, an NCF in only a portion of a space between the printed circuit board and the semiconductor chip, the NCF surrounding the connection terminal and bonding the printed circuit board to the semiconductor chip, and a side encapsulation material between a bottom surface of the semiconductor chip and the top surface of the printed circuit board, the side encapsulation material covering a side surface of the semiconductor chip and contacting the printed circuit board.

According to an example embodiment of the inventive concepts, a semiconductor package includes a package substrate, a semiconductor chip on a top surface of the package substrate, an NCF only between the package substrate and a portion of a bottom surface of the semiconductor chip, the NCF having a larger horizontal area than the semiconductor chip, and a side encapsulation material along a side surface of the semiconductor chip, the side encapsulation material covering the side surface of the semiconductor chip and contacting the top surface of the package substrate and the bottom surface of the semiconductor chip.

BRIEF DESCRIPTION OF THE DRAWINGS

Some example embodiments of the inventive concepts will be more clearly understood from the following detailed description taken in conjunction with the accompanying drawings in which:

FIG. 1D is a cross-sectional view taken along a line ID-ID' in FIG. 1A;

DETAILED DESCRIPTION

Figure 1A:
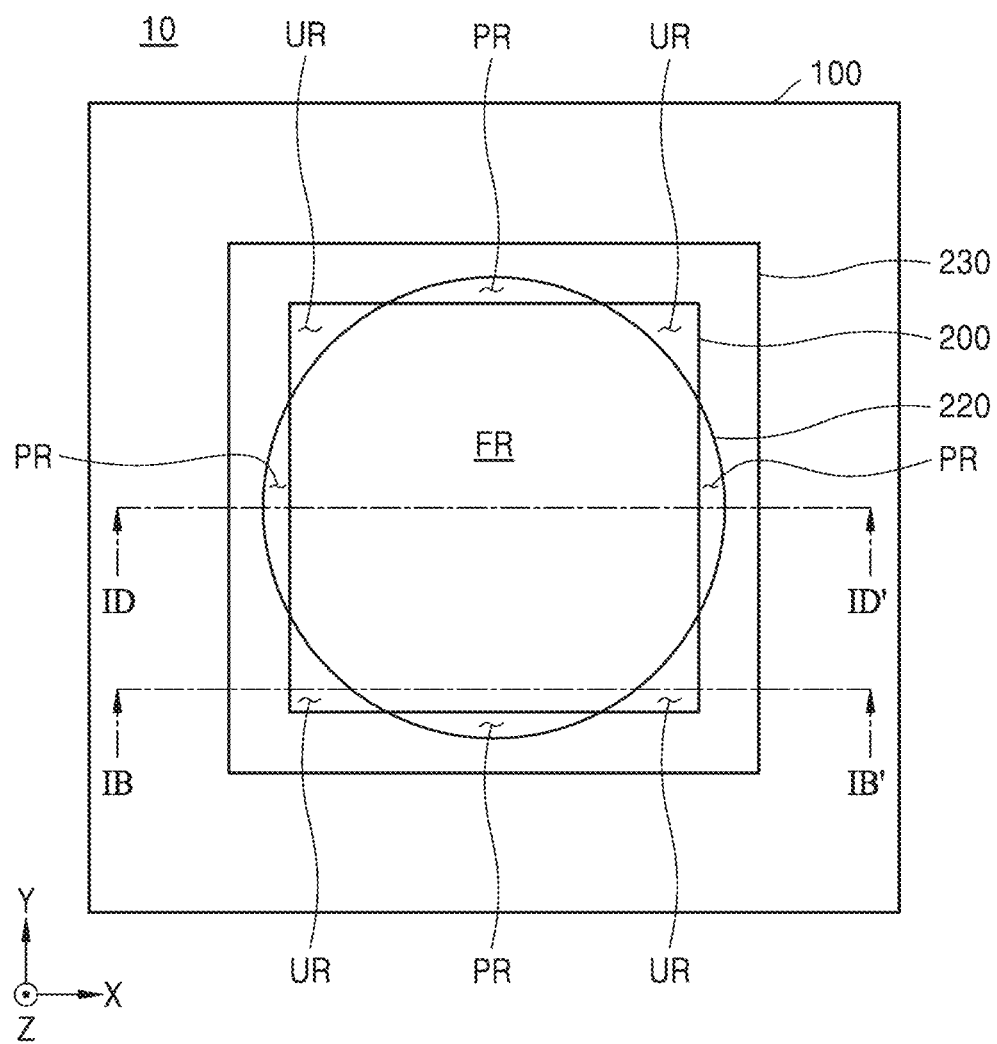
FIG. 1A is a schematic layout diagram of a semiconductor package according to an example embodiment.

Hereinafter, some example embodiments will be described in detail with reference to the accompanying drawings. In the drawings, like reference numerals denote like elements, and redundant descriptions thereof will be omitted. In the drawings, the thickness and size of layers may be exaggerated for convenience and clarity, and therefore, the shapes and dimensions of the layers may be different from actual ones.

While the term "same" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values are modified as "about" or "substantially," it will be understood that these values should be construed as including a manufacturing or operational tolerance (e.g., ±10%) around the stated numerical.

As used herein, the term "and/or" includes any and all combinations of one or more of the associated listed items. Expressions such as "at least one of," when preceding a list of elements, modify the entire list of elements and do not modify the individual elements of the list. Thus, for example, "A, B, and C" means either A, B, C or any combination thereof.

FIG. 1A is a schematic layout diagram of a semiconductor package 10 according to an example embodiment.

Figure 1B:
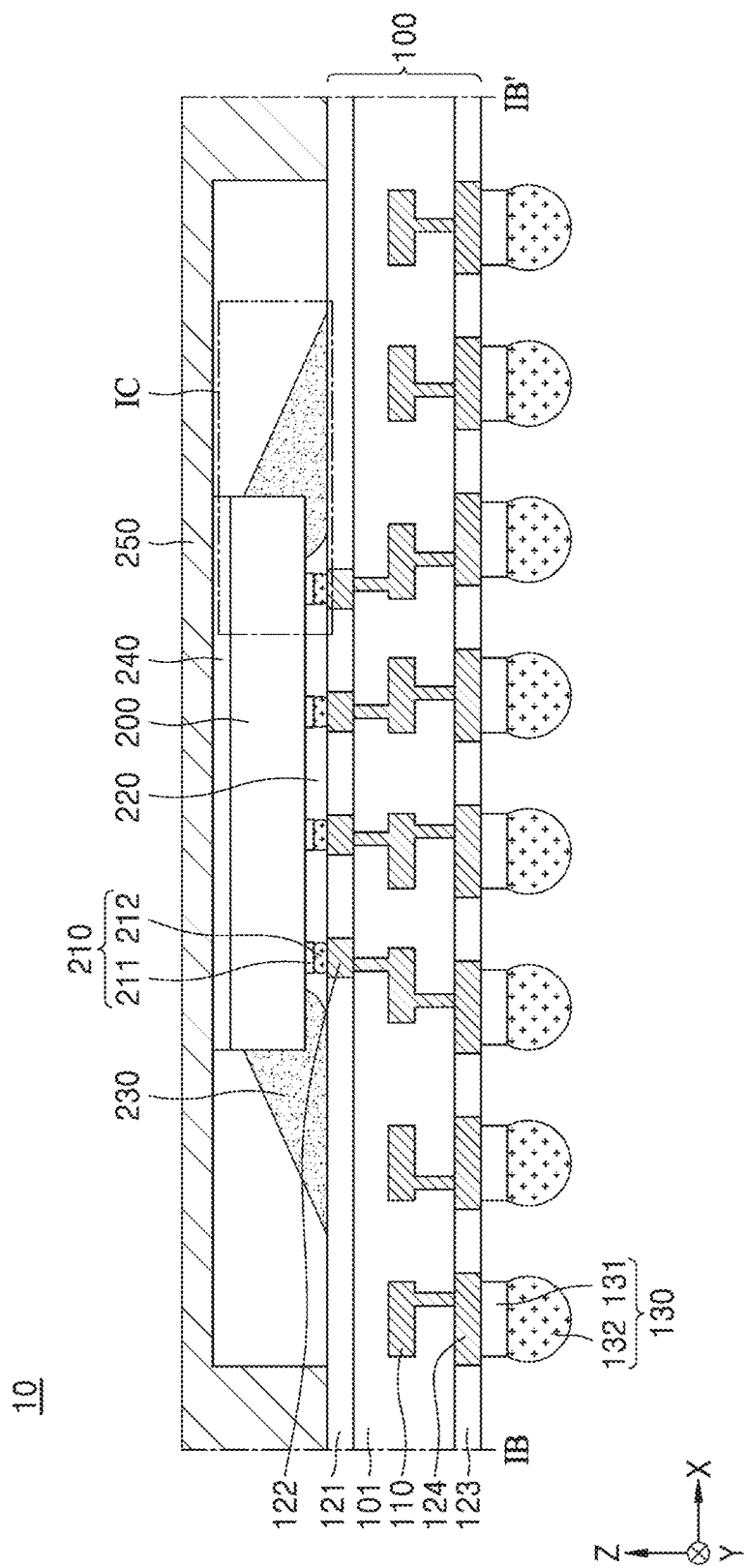
FIG. 1B is a cross-sectional view taken along a line IB-IB' in FIG. 1A.

FIG. 1B is a cross-sectional view taken along a line IB-IB' in FIG. 1A.

Figure 1C:
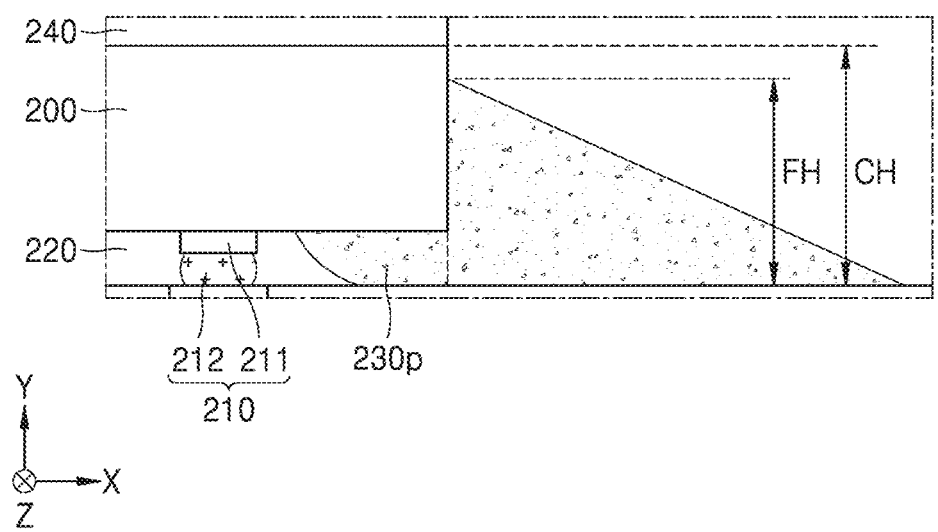
FIG. 1C is an enlarged view of a region IC in FIG. 1B.

FIG. 1C is an enlarged view of a region IC in FIG. 1B.

FIG. 1D is a cross-sectional view taken along a line ID-ID' in FIG. 1A.

Referring to FIGS. 1A through 1D, the semiconductor package 10 may include a package substrate 100 and a semiconductor chip 200. The semiconductor package 10 may also include solder 212, a non-conductive film (NCF) 220, and a side encapsulation material 230. According to some example embodiments, the semiconductor package 10 may further include a thermal interface material (TIM) layer 240, and a heat sink 250.

The semiconductor chip 200 may be stacked on the package substrate 100. A direction in which the semiconductor chip 200 is stacked on the package substrate 100 is defined as a Z direction. Two directions that are perpendicular to the Z direction and cross each other are defined as an X direction and a Y direction. The X direction is substantially perpendicular to the Y direction. A vertical direction refers to the Z direction. A horizontal direction refers to one of the X direction, the Y direction, and a direction that is oblique to the X and Y directions and perpendicular to the Z direction. A vertical level refers to a height in the vertical direction, and a horizontal width refers to a width in the horizontal direction.

The package substrate 100 may include, for example, a printed circuit board. The package substrate 100 may include a substrate base 101 and solder resist layers 121 and 123 respectively on top and bottom surfaces of the substrate base 101. The package substrate 100 may include upper pads 122, which are formed on the top surface of the substrate base 101 and exposed through the solder resist layer 121, and lower pads 124, which are formed on the bottom surface of the substrate base 101 and exposed through the solder resist layer 123.

The substrate base 101 may include at least one selected from phenol resin, epoxy resin, and polyimide. For example, the substrate base 101 may include at least one material selected from frame retardant 4 (FR4), tetrafunctional epoxy, polyphenylene ether, epoxy/polyphenylene oxide, bismaleimide triazine (BT), thermount, cyanate ester, polyimide, and liquid crystal polymer.

An internal wiring 110, which is electrically connected to the upper pads 122 and/or the lower pads 124, may be formed in the substrate base 101.

The upper pads 122 and the lower pads 124 may include copper, nickel, stainless steel, or beryllium copper. The upper pads 122 and the lower pads 124 may be portions of a circuit wiring formed by patterning a copper foil on the top and bottom surfaces of the substrate base 101, where the portions of the circuit wiring are exposed through the solder resist layers 121 and 123.

External connection terminals 130 may be attached to a bottom surface of the package substrate 100. For example, the external connection terminals 130 may be attached to the lower pads 124, respectively. The external connection terminals 130 may include, for example, solder or a bump. The external connection terminals 130 may electrically connect the semiconductor package 10 to an external device.

According to some example embodiments, the external connection terminals 130 may include an under bump metallurgy (UBM) layer 131 on the bottom surface of the package substrate 100 and solder 132 on the UBM layer 131. The external connection terminals 130 may further include a conductive pillar (not illustrated) between the UBM layer 131 and the solder 132. The conductive pillar may include, for example, copper.

The external connectors 130 may be terminals for input/output of signals and power transmission. For example, the external connection terminals 130 may be an input/output (I/O) terminal that receives an input signal and transmits an output signal, a ground terminal that specifies a ground potential, or a power terminal that supplies operating power.

The UBM layer 131 may include, for example, chromium (Cr), tungsten (W), titanium (Ti), copper (Cu), nickel (Ni), aluminum (Al), palladium (Pd), gold (Au), or a combination thereof. The UBM layer 131 may include a single metal layer or a stack structure of a plurality of metal layers.

For example, the UBM layer 131 may include first through third metal layers sequentially stacked on each of the lower pads 124. The first metal layer may include an adhesive layer used to stably attach the solder 132 to a lower pad 124. For example, the first metal layer may include at least one material selected from Ti, TiW, Cr, and Al. The second metal layer may include a barrier layer that blocks or prevents a metal material from diffusing into the package substrate 100. The second metal layer may include at least one selected from Cu, Ni, Cr—Cu, and nickel vanadium (Ni—V). The third metal layer may include a wetting layer that enhances the wetting characteristic of the solder 132 or a seed layer for an external connection pillar. The third metal layer may include at least one selected from Ni, Cu, and Al.

In some example embodiments, the solder 132 may have a spherical or ball shape. The solder 132 may include tin (Sn), indium (In), bismuth (Bi), antimony (Sb), Cu, silver (Ag), zinc (Zn), lead (Pb), and/or an alloy thereof. For example, the solder 132 may include at least one of Sn, Pb, Sn—Pb, Sn—Ag, Sn—Au, Sn—Cu, Sn—Bi, Sn—Zn, Sn—Ag—Cu, Sn—Ag—Bi, Sn—Ag—Zn, Sn—Cu—Bi, Sn—Cu—Zn, and Sn—Bi—Zn.

In some example embodiments, the vertical height and horizontal width of the external connection terminals 130 may be about 50 μm or greater. However, the vertical height and horizontal width of the external connection terminals 130 are not limited thereto.

The semiconductor chip 200 may have a relatively large size in terms of a horizontal area. According to some example embodiments, the horizontal area of the semiconductor chip 200 may be about 100 mm$^2$ or greater. According to some example embodiments, an X-direction length of the semiconductor chip 200 may be about 10 mm or greater, and a Y-direction length of the semiconductor chip 200 may be about 10 mm or greater. According to some example embodiments, the X-direction length of the semiconductor chip 200 may be about 20 mm or greater, and the Y-direction length of the semiconductor chip 200 may be about 20 mm or greater.

Although FIG. 1A shows the semiconductor chip 200 having a square shape in a top view example embodiments according to present inventive concepts are not limited thereto. For example, the semiconductor chip 200 may have a rectangular shape from top view. In this case, a width of the semiconductor chip 200 in one direction (e.g., the X direction) may be greater than that in another direction (e.g., the Y direction).

The semiconductor chip 200 may include, for example, a logic chip. The logic chip may include a gate array, a cell base array, an embedded array, a structured application-specific integrated circuit (ASIC), a field programmable gate array (FPGA), a complex programmable logic device (CPLD), a central processing unit (CPU), a micro processing unit (MPU), a micro controller unit (MCU), a logic integrated circuit (IC), an application processor (AP), a Display Driver IC (DDI), a radio frequency (RF) chip, or a complementary metal-oxide semiconductor (CMOS) image sensor.

However, example embodiments of the present inventive concepts are not limited thereto, and the semiconductor chip 200 may include a memory chip. The memory chip may include, for example, a volatile memory chip such as dynamic random access memory (DRAM) or static RAM (SRAM) or a non-volatile memory chip such as phase-change RAM (PRAM), magnetoresistive RAM (MRAM), ferroelectric RAM (FeRAM), or resistive RAM (ReRAM). According to some example embodiments, the semiconductor chip 200 may include high bandwidth memory (HBM) including a DRAM chip.

The semiconductor chip 200 may be connected to the package substrate 100 through connection terminals 210. The connection terminals 210 may include a UBM layer 211 and the solder 212. Each of the UBM layer 211 and the solder 212 of the connection terminals 210 may include the same material as a corresponding one of the UBM layer 131 and the solder 132 of the external connection terminals 130. Each of the UBM layer 211 and the solder 212 of the connection terminals 210 may have a smaller size (e.g., smaller horizontal width and vertical height) than a corresponding one of the UBM layer 131 and the solder 132 of the external connection terminals 130.

The NCF 220 may be arranged between the semiconductor chip 200 and the package substrate 100. The NCF 220 may include an adhesive film that bonds the semiconductor chip 200 to the package substrate 100. The NCF 220 may include an insulating material. The semiconductor chip 200 and the package substrate 100 may be bonded to each other using a thermo-compression process using an NCF, which will be described below.

The shape of the NCF 220 from top view may be different from the shape of the semiconductor chip 200 from top view. The horizontal cross-sectional area of the NCF 220 may be different from that of the semiconductor chip 200. The horizontal cross-sectional area of the NCF 220 may be greater than that of the semiconductor chip 200, but example embodiments are not limited thereto. For example, the horizontal cross-sectional area of the NCF 220 may be equal to or less than that of the semiconductor chip 200.

The shape of the NCF 220 from top view may include a curved contour line. The shape of the NCF 220 from top view may be substantially circular. However, example embodiments of the present inventive concepts are not limited thereto, and the shape of the NCF 220 from top view may be elliptical or irregular.

The NCF 220 may not be disposed below a portion of the semiconductor chip 200. In other words, the NCF 220 may not be disposed in at least a portion between the semiconductor chip 200 and the package substrate 100. A portion between the semiconductor chip 200 and the package substrate 100 in which the NCF 220 is not disposed is defined as an unfilled region UR. A portion between the semiconductor chip 200 and the package substrate 100 in which the NCF 220 is disposed is defined as a filled region FR. A portion of the NCF 220 protruding outwards from the semiconductor chip 200 as viewed from above is defined as a protruding region PR. The unfilled region UR may vertically overlap a corner of the semiconductor chip 200. The horizontal width (e.g., the X-direction width or the Y-direction width) of the unfilled region UR may be about 5 mm or less, but is not limited thereto.

Although it is illustrated in FIG. 1A that four unfilled regions UR are formed in correspondence to the corners of the semiconductor chip 200, example embodiments of the present inventive concepts are not limited thereto. In some example embodiments, the NCF 220 may not be disposed below some of the corners of the semiconductor chip 200 such that one to three unfilled regions UR may be formed.

The NCF 220 may include a filler. The filler may include a silica filler but is not limited thereto. According to some example embodiments, the NCF 220 may have a filler content of about 30 wt % to about 60 wt %. The NCF 220 may be transparent. When the NCF 220 has filler content that is less than 30 wt %, the Young's modulus of the NCF 220 is too low for the NCF 220 to properly support the semiconductor chip 200 and the package substrate 100. When the NCF 220 has filler content that is greater than 60 wt %, the NCF 220 is not transparent, and accordingly, reliability of singulation may decrease. According to some example embodiments, the filler content of the NCF 220 may be lower than that of the side encapsulation material 230.

Because the NCF 220 has an appropriate filler content (e.g., about 30 wt % to about 60 wt %), the Young's modulus of the NCF 220 may be in an appropriate range. Accordingly, the NCF 220 may have an appropriate hardness for handling in a wafer-level molding process, which will be described below, and subsequent processes.

The side encapsulation material 230 may surround or cover at least a portion of the side surface of the semiconductor chip 200. The side encapsulation material 230 may further cover a portion of the bottom surface of the semiconductor chip 200. The side encapsulation material 230 may further cover the bottom surface of the semiconductor chip 200 in each unfilled region UR. In other words, the side encapsulation material 230 may be further arranged between the semiconductor chip 200 and the package substrate 100.

The side encapsulation material 230 may be in contact with the NCF 220 on the border between the unfilled region UR and the filled region FR. According to some example embodiments, the NCF 220 and the side encapsulation material 230 may together completely fill a space between the semiconductor chip 200 and the package substrate 100 (see FIG. 1B). However, example embodiments of the present inventive concepts are not limited thereto. A void may be partially formed between the semiconductor chip 200 and the package substrate 100.

The NCF 220 may include a concave profile in the vertical cross-sectional views of FIGS. 1B and 1C. A portion 230p of the side encapsulation material 230 between the semiconductor chip 200 and the package substrate 100 may have a complementary shape with respect to the NCF 220. Accordingly, the portion 230p may include a convex profile. However, example embodiments of the present inventive concepts are not limited thereto. In some example embodiments, the vertical cross-sectional profiles of the NCF 220 and the portion 230p may be straight lines, or the vertical cross-sectional profile of the NCF 220 may be convex and the vertical cross-sectional profile of the portion 230p may be concave.

Referring to FIGS. 1B and 1C, a vertical level from the top surface of the package substrate 100 to the top surface of the semiconductor chip 200 is defined as a chip height CH, and the vertical height of the side encapsulation material 230 is defined as a fillet height FH. According to some example embodiments, the fillet height FH may be equal to or less than the chip height CH. According to some example embodiments, the fillet height FH may be at least 50% of the chip height CH. When the fillet height FH is at least 50% of the chip height CH, the semiconductor chip 200 may be supported on the package substrate 100 with sufficient mechanical strength. Accordingly, the side encapsulation material 230 may not cover the top surface of the semiconductor chip 200. However, example embodiments of the present inventive concepts are not limited thereto. In some example embodiments, the side encapsulation material 230 may partially or entirely cover the top surface of the semiconductor chip 200.

The side encapsulation material 230 may include resin. The side encapsulation material 230 may include a different material from the NCF 220. The side encapsulation material 230 may include a silicon-based material, a thermosetting material, a thermoplastic material, an ultraviolet (UV) curing material, or the like. When the side encapsulation material 230 includes a thermosetting material, the side encapsulation material 230 may include a phenol-type, an acid anhydride-type, or an amine-type hardener and an acrylic polymer additive.

The side encapsulation material 230 may further include a filler. The filler content of the side encapsulation material 230 may be higher than the filler content of the NCF 220. According to some example embodiments, the side encapsulation material 230 may have a filler content of about 40 wt % to about 90 wt % The Young's modulus of the side encapsulation material 230 may be greater than the Young's modulus of the NCF 220. The side encapsulation material 230 may be more opaque than the NCF 220.

Referring back to FIG. 1A, the inner contour line of the shape of the side encapsulation material 230 from top view (or of the horizontal cross-sectional shape of the side encapsulation material 230 at the same level as the top surface of the package substrate 100) may be different from the outer contour line thereof. For example, the inner contour line of the layout of the side encapsulation material 230 may include a curved line, and the outer contour line of the layout of the side encapsulation material 230 may include a straight line. Because the shape of the NCF 220 is transferred during a process of forming the side encapsulation material 230, the inner contour line of the layout of the side encapsulation material 230 may be the same as or substantially similar to the outer contour line of the layout of the NCF 220. Because the shape of the semiconductor chip 200 is transferred during a process of forming the side encapsulation material 230, the outer contour line of the layout of the side encapsulation material 230 may be the same as or substantially similar to the outer contour line of the layout of the semiconductor chip 200.

The TIM layer 240 may be arranged on the semiconductor chip 200. The TIM layer 240 may include a heat conductive compound for dissipating heat in a high-power device of a semiconductor module. The TIM layer 240 may reduce the thermal contact resistance between a metal of a high-power device and the heat sink 250.

The TIM layer 240 may have a relatively high filler content. The TIM layer 240 may provide a highly reliable thermal contact resistance characteristic starting in a situation where there is a great temperature change (e.g., the initial operation of the semiconductor chip 200). Accordingly, the semiconductor package 10 may be operable without a separate burn-in cycle. The TIM layer 240 may include an insulating layer but is not limited thereto. According to some example embodiments, the TIM layer 240 may not include silicon. The TIM layer 240 may enhance heat dissipation by mitigating or preventing a void from being formed between the semiconductor chip 200 and the heat sink 250.

The heat sink 250 may be a sort of passive heat exchanger. The heat sink 250 may control the semiconductor chip 200 to be at an optimal operation temperature. The heat sink 250 may have a structure (e.g., a corrugated structure) that enlarges or maximizes a surface area contacting a cooling medium.

The heat sink 250 may include copper or aluminum but is not limited thereto. When the heat sink 250 includes copper, the heat sink 250 may have relatively high thermal efficiency and relatively high endurance. When the heat sink 250 includes aluminum, the heat sink 250 has a lower thermal conductivity than when the heat sink 250 includes copper, but the manufacturing cost and the weight of the heat sink 250 may be reduced.

Figure 2:
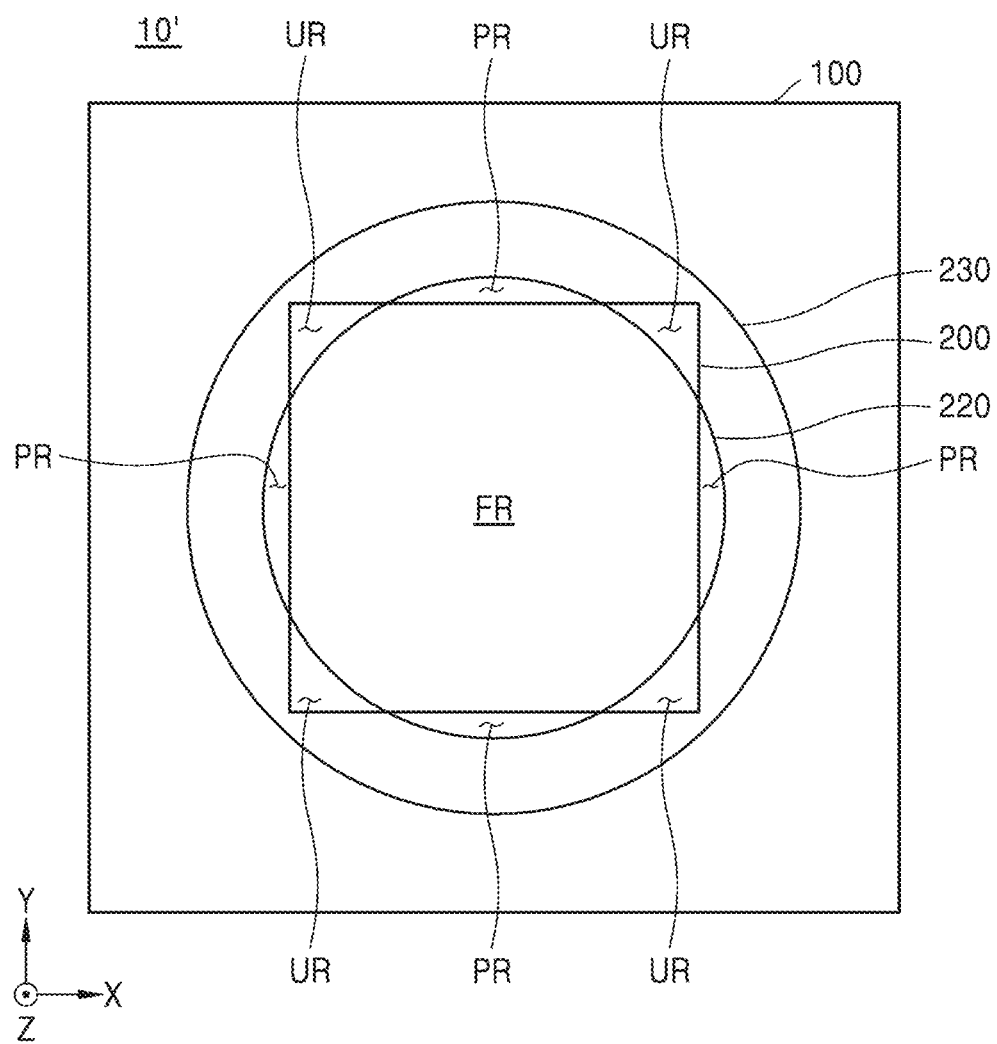
FIG. 2 is a schematic layout diagram of a semiconductor package according to an example embodiment.

FIG. 2 is a schematic layout diagram of a semiconductor package 10' according to an example embodiment.

For convenience of description, redundant descriptions given above with reference to FIGS. 1A through 1D will be omitted, and descriptions below will be focused on differences.

Referring to FIG. 2, the semiconductor package 10' may include the side encapsulation material 230 that has a different shape from top view than the side encapsulation material 230 of the semiconductor package 10 of FIG. 1A.

According to some example embodiments, the side encapsulation material 230 may be smaller than the side encapsulation material 230 of FIG. 1A. For example, the side encapsulation material 230 may have a less horizontal width from the side encapsulation material 230 of FIG. 1A. Accordingly, because the shape of the NCF 220 is transferred to the side encapsulation material 230, the inner and outer contour lines of the shape of the side encapsulation material 230 from top view may include a curved line. For example, when the shape of the NCF 220 from top view has a circular contour line, both the inner and outer contour lines of the shape of the side encapsulation material 230 from top view may be concentric to a center of the circular contour line of the NCF 220.

According to some example embodiments, the shape of the semiconductor chip 200 in the unfilled region UR and the shape of the NCF 220 in the protruding region PR may be transferred to the shape of the side encapsulation material 230 from top view. In such cases, in the outer contour line of the shape of the side encapsulation material 230 from top view, a middle portion between corners may include a curved line and each corner may include a straight line.

Figure 3A:
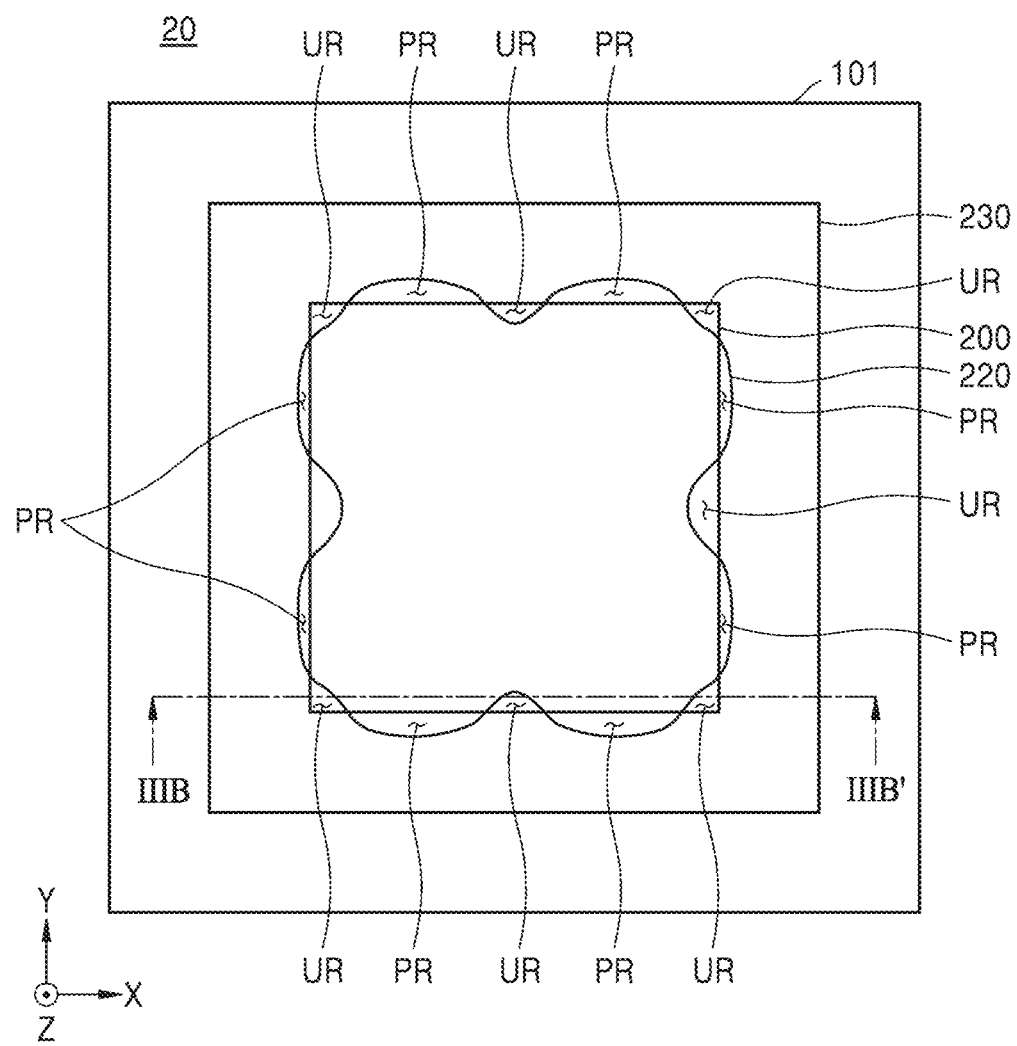
FIG. 3A is a schematic layout diagram of a semiconductor package according to an example embodiment.

FIG. 3A is a schematic layout diagram of a semiconductor package 20 according to an example embodiment.

Figure 3B:
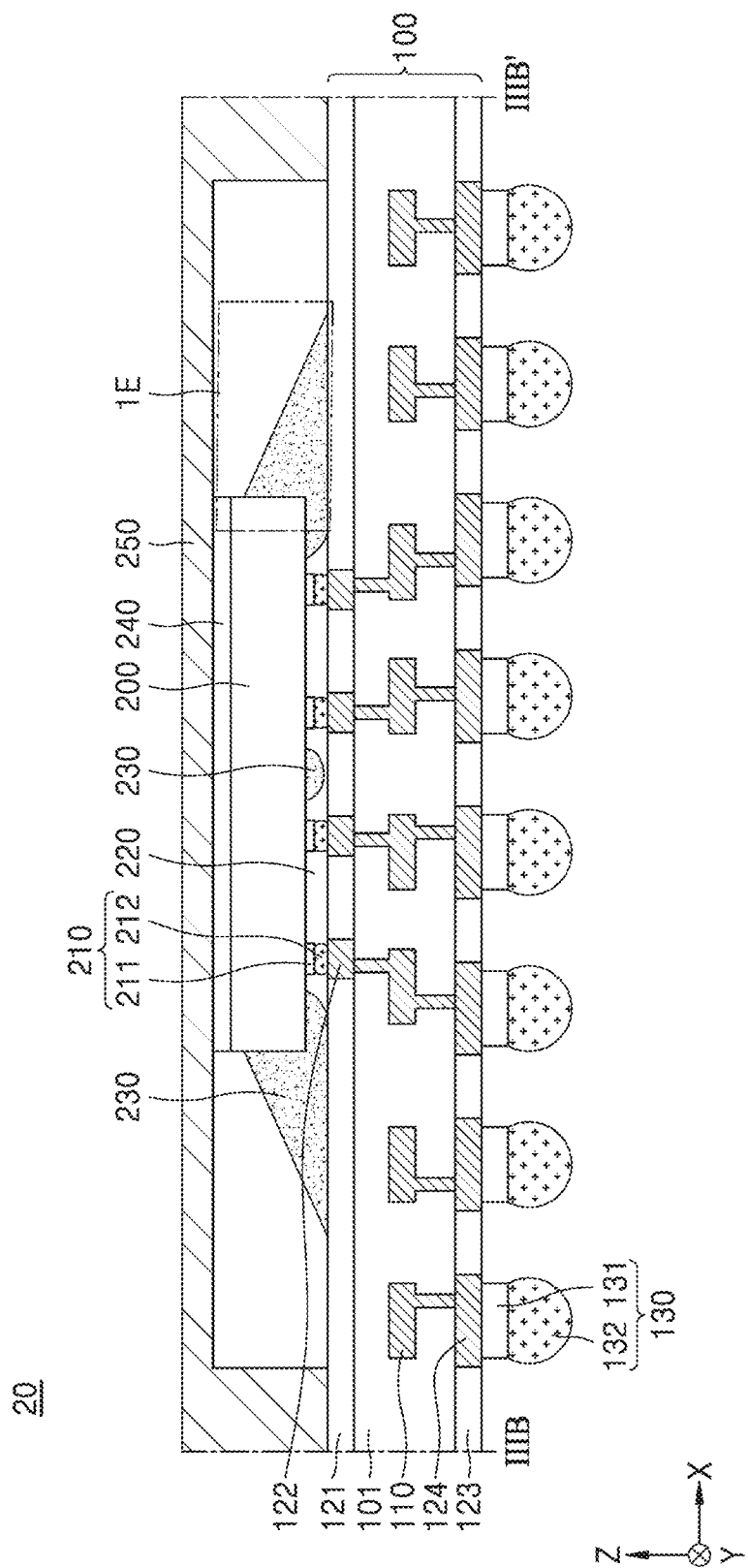
FIG. 3B is a cross-sectional view taken along a line IIIB-IIIB' in FIG. 3A.

FIG. 3B is a cross-sectional view taken along a line IIIB-IIIB' in FIG. 3A.

For convenience of description, redundant descriptions given above with reference to FIGS. 1A through 1D will be omitted, and descriptions below will be focused on differences.

Referring to FIGS. 3A and 3B, unlike the semiconductor package 10 of FIGS. 1A through 1D, the unfilled region UR may be further defined below each side of the semiconductor chip 200 that is away from two adjacent corners of the semiconductor chip 200. Accordingly, the NCF 220 may have an X or a four-leaf clover shape from top view. Accordingly, two protruding regions PR may be defined with respect to each side of the semiconductor chip 200.

Although it is illustrated in FIGS. 3A and 3B that the unfilled region UR is defined in correspondence to a middle portion of each side of the semiconductor chip 200 in addition to each corner of the semiconductor chip 200, example embodiments of the present inventive concepts are not limited thereto. For example, the unfilled region UR may not be defined in correspondence to some of the corners of the semiconductor chip 200 or may be defined in correspondence to only some of the sides of the semiconductor chip 200.

Figure 4:
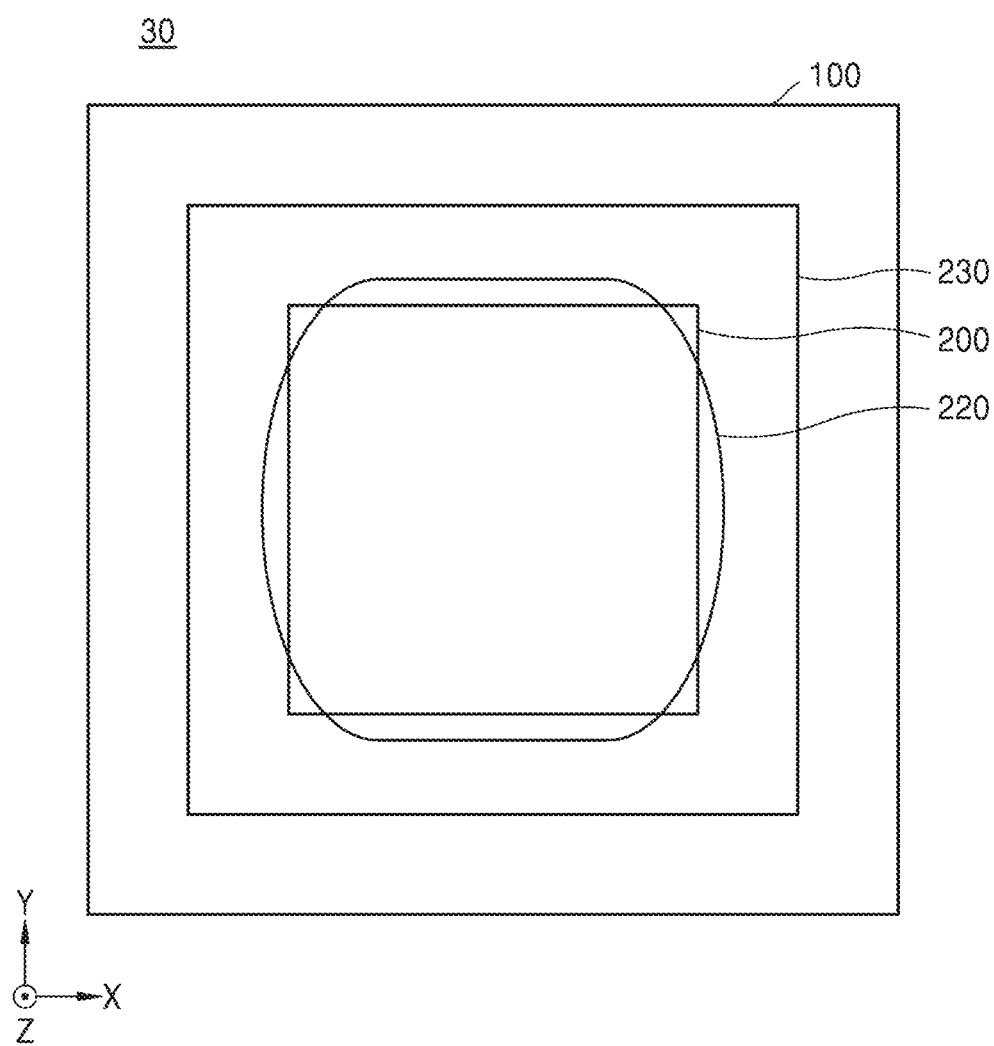
FIG. 4 is a schematic layout diagram of a semiconductor package according to an example embodiment.

FIG. 4 is a schematic layout diagram of a semiconductor package 30 according to an example embodiment.

For convenience of description, redundant descriptions given above with reference to FIGS. 1A through 1D will be omitted, and descriptions below will be focused on differences.

Referring to FIG. 4, when viewed from above, the NCF 220 may protrude from the semiconductor chip 200 in the X direction and in the Y direction. According to some example embodiments, the contour line of the NCF 220 from top view may include a curved portion and a straight portion.

Figure 5:
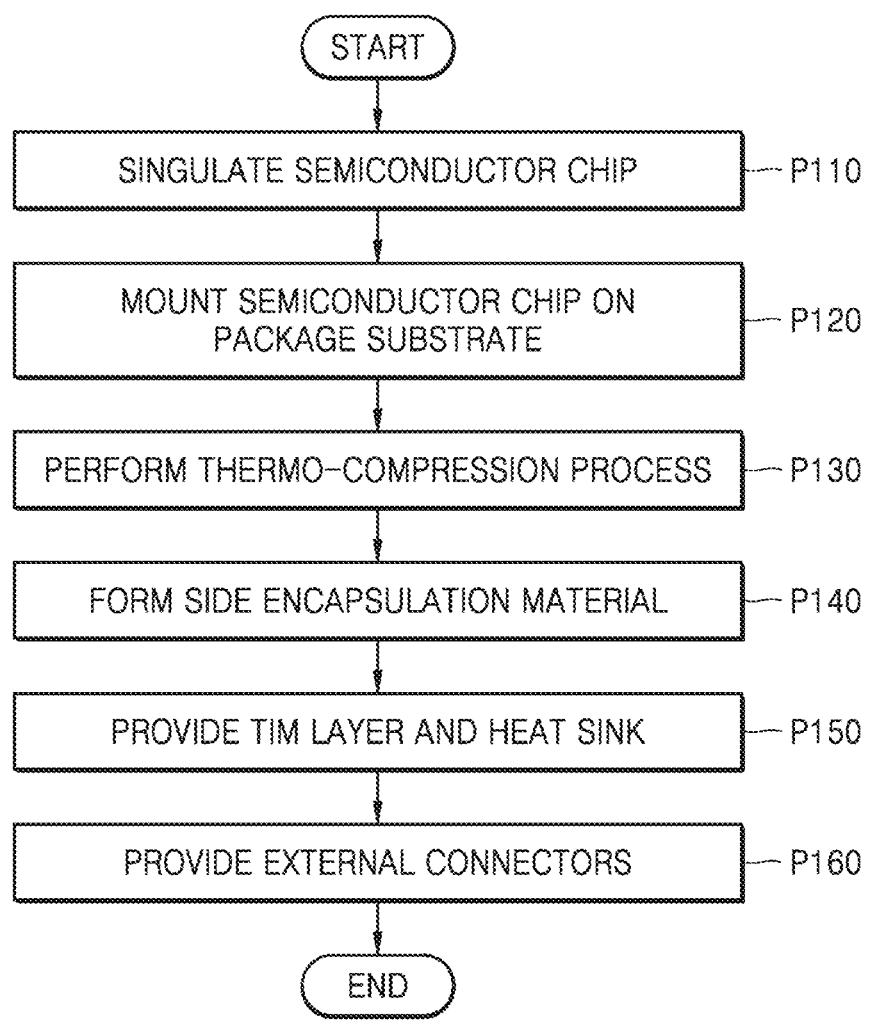
FIG. 5 is a schematic flowchart of a method of manufacturing a semiconductor package, according to an example embodiment.

FIG. 5 is a schematic flowchart of a method of manufacturing a semiconductor package, according to an example embodiment.

FIGS. 6 through 10 are cross-sectional views of stages in a method of manufacturing a semiconductor package, according to an example embodiment.

Figure 6:
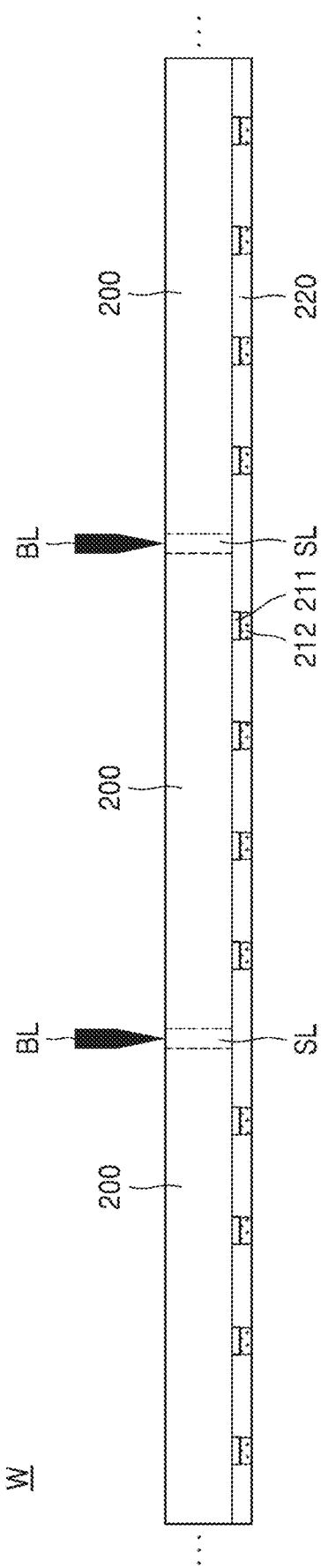
FIGS. 6 through 10 are cross-sectional views of stages in a method of manufacturing a semiconductor package, according to an example embodiment.

Referring to FIGS. 5 and 6, semiconductor chips 200 may be singulated in operation P110.

The singulation of the semiconductor chips 200 may include cutting a wafer W, which includes the semiconductor chips 200 and has the NCF 220 attached thereto, along scribe lanes SL. The NCF 220 may include a transparent material. The NCF 220 may have a filler content of about 30 wt % to about 60 wt %, based on the total weight thereof. Due to the transparency of the NCF 220, reliability of a singulation process may be enhanced.

Before the singulation process, a series of processes for forming circuit devices included in the semiconductor chips 200, a process of providing connectors 210, and a process of providing the NCF 220 may be performed. These processes may include wafer-level processes, which are performed on the front side of the wafer W before the singulation of the semiconductor chips 200, and a back-end-of-line (BEOL) process including metallization for connecting the circuit devices of the semiconductor chips 200 to the connection terminals 210.

Although it is illustrated in FIG. 6 that singulation is performed using a dicing blade BL, example embodiments of the present inventive concepts are not limited thereto. For example, singulation may be performed using laser sawing.

Figure 7:
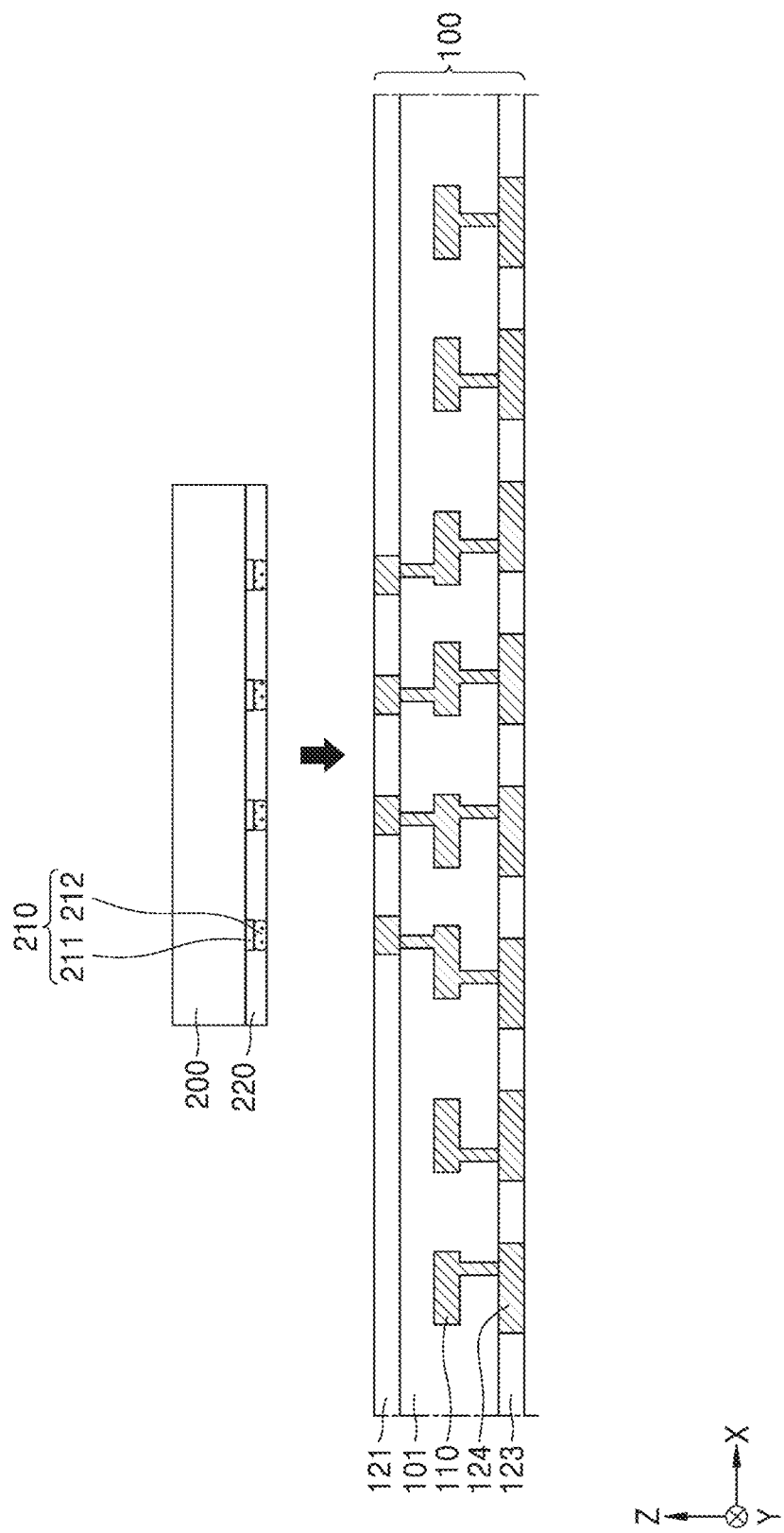

Referring to FIGS. 5 and 7, a semiconductor chip 200 may be mounted on the package substrate 100 in operation P120.

Because the NCF 220 is also singulated during the singulation of the semiconductor chip 200, the shape and the area of the NCF 220 may be the same as those of the semiconductor chip 200, from top view.

Figure 8:
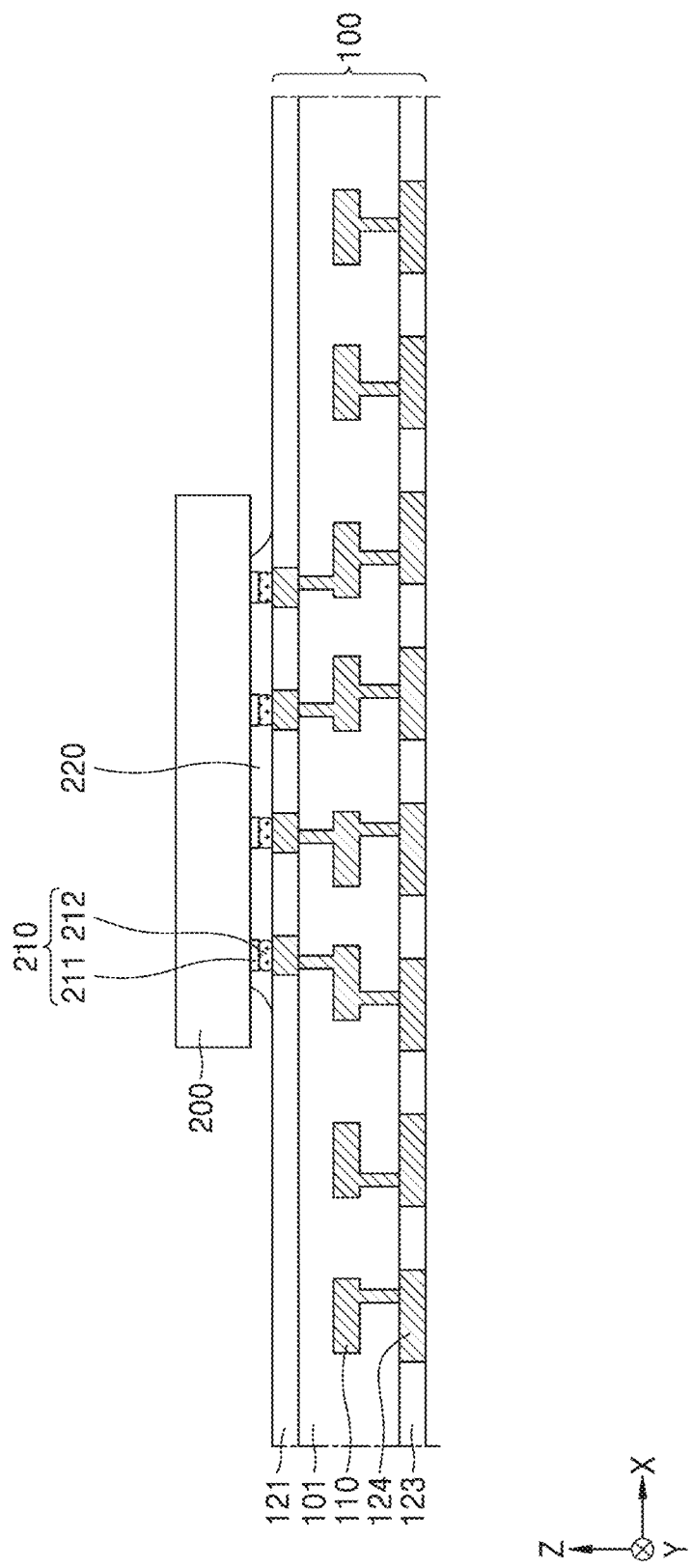

Referring to FIGS. 5 and 8, a thermo-compression process may be performed in operation P130.

The thermo-compression process may include pressing the semiconductor chip 200 on the package substrate 100 with a certain heat and pressure using a pressing head including a heating member.

Due to the thermo-compression process, the solder 212 may be connected to a corresponding one of the upper pads 122 and the NCF 220 may be hardened. According to some example embodiments, the shape of the NCF 220 may be changed by the thermo-compression process, and accordingly, the top-view shape and horizontal area of the NCF 220 may be different from those of the semiconductor chip 200. When the shape of the NCF 220 is changed by the thermo-compression process, the NCF 220 may not be disposed in at least a portion of the space between the semiconductor chip 200 and the package substrate 100.

Figure 9:
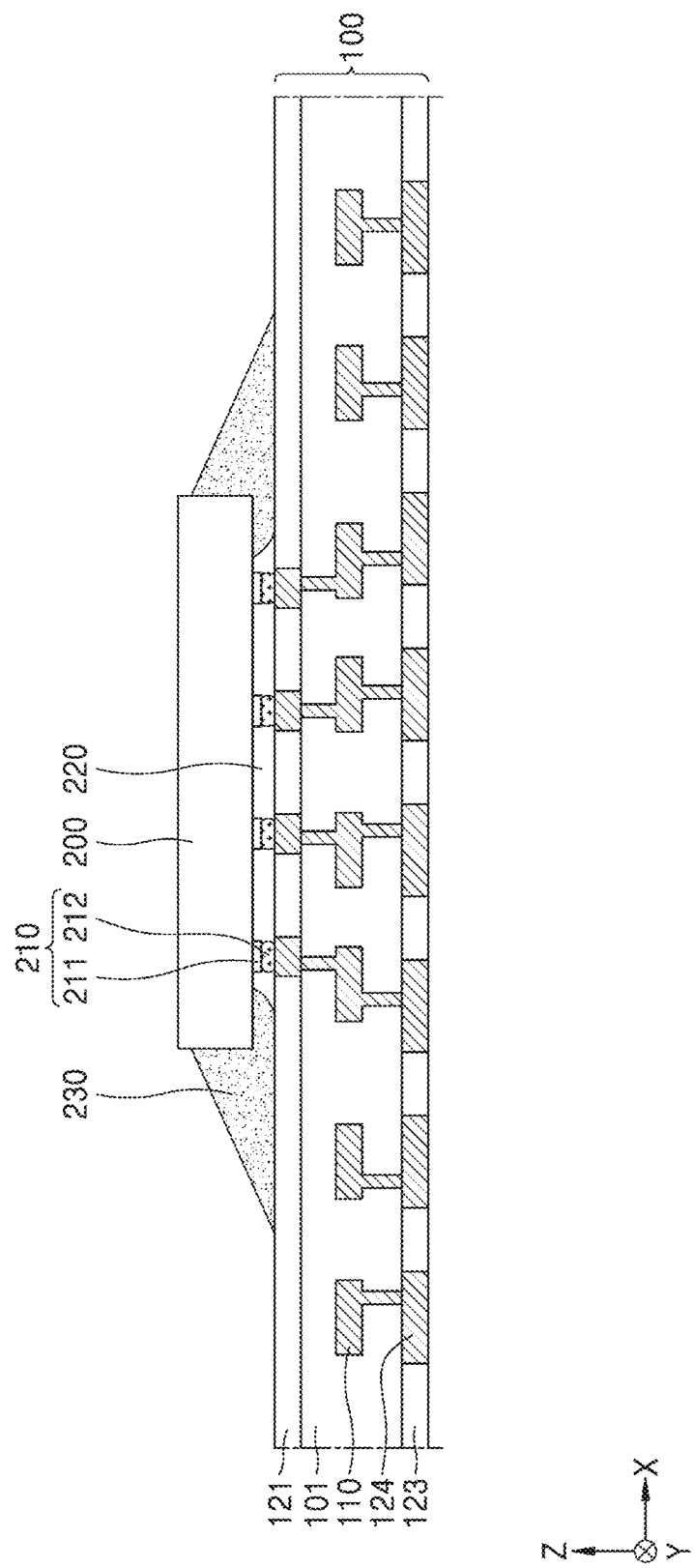

Referring to FIGS. 5 and 9, the side encapsulation material 230 may be formed in operation P140.

The forming of the side encapsulation material 230 may include providing an underfill material (e.g., liquid resin) along the side surface of the semiconductor chip 200 and hardening the underfill material such that the semiconductor chip 200 is bonded to the package substrate 100. The liquid resin may include may fill the space between the semiconductor chip 200 and the package substrate 100, in which the NCF 220 is not present, to form the side encapsulation material 230.

Accordingly, the side encapsulation material 230 and the NCF 220 together completely fill the space between the semiconductor chip 200 and the package substrate 100, and therefore, reliability of the semiconductor package may be enhanced.

With the use of artificial intelligence (AI) logic chips and fifth generation (5G) modules, high-performance and high-power semiconductor chips are used in a system package. The high-performance and high-power semiconductor chips include I/O terminals having an ultrafine pitch to have increased I/O capacity and use a large body substrate (LBS) technique to have a relatively large chip size (e.g., a horizontal area of 100 mm$^2$ or greater).

As for the high-performance and high-power semiconductor chips, when a reflow process is applied to a fine-pitch semiconductor chip including an ultra low-K (ULK) dielectric layer to mitigate or prevent resistance-capacitance (RC) delay, BEOL crack and bump-open failure may occur due to thermal expansion coefficient mismatch between the semiconductor chip and a package substrate (e.g., a printed circuit board).

To mitigate or prevent such BEOL crack and bump-open failure, the reflow process may be substituted by a thermo-compression process using an NCF. During the thermo-compression process, a semiconductor chip is simultaneously heated and pressed using a bonding tool. Due to the thermo-compression process, the NCF is hardened and supports bumps, thereby alleviating stress applied to the bumps during a bonding process.

Because the bonding characteristic of an NCF is put first in a thermo-compression process using the NCF, it is technically difficult to control the mechanical properties of the NCF. In some example embodiments, the NCF may not be formed or irregularly formed in the edge and corners of a semiconductor chip to avoid crack or delamination along the edges (e.g., corners) of the semiconductor chip.

According to some example embodiments, after a thermo-compression process using an NCF is performed, a side encapsulation material having a relatively high filler content per mass is provided along the outer edge of a semiconductor chip. Accordingly, the NCF may be mitigated or prevented from cracking and delaminating, and therefore semiconductor package manufacturing reliability may be enhanced.

Figure 10:
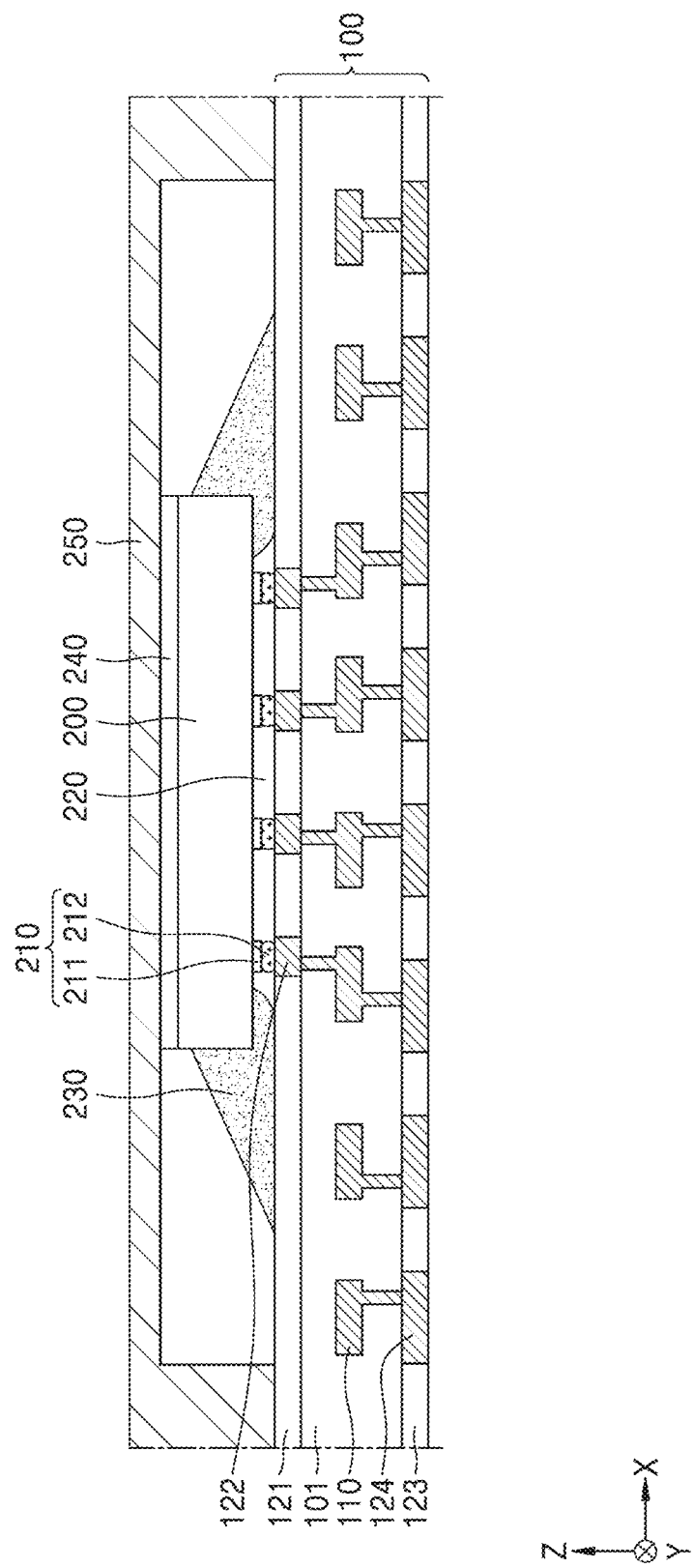

Referring to FIGS. 5 and 10, the TIM layer 240 and the heat sink 250 may be provided in operation P150.

The TIM layer 240 and the heat sink 250 are the same as or substantially similar to those described with reference to FIGS. 1A through 1D.

Subsequently, referring to FIGS. 5 and 1B, the external connection terminals 130 are provided in operation P160.

According to some example embodiments, the external connection terminals 130 may include the UBM layer 131 and the solder 132. The UBM layer 131 and the solder 132 may be formed using electroplating.

FIGS. 11 through 14 are schematic layout diagrams of semiconductor packages 40, 50, 60, and 70 according to some example embodiments.

For convenience of description, the descriptions given above with reference to FIGS. 1A through 1D will be omitted, and descriptions below will be focused on differences.

Figure 11:
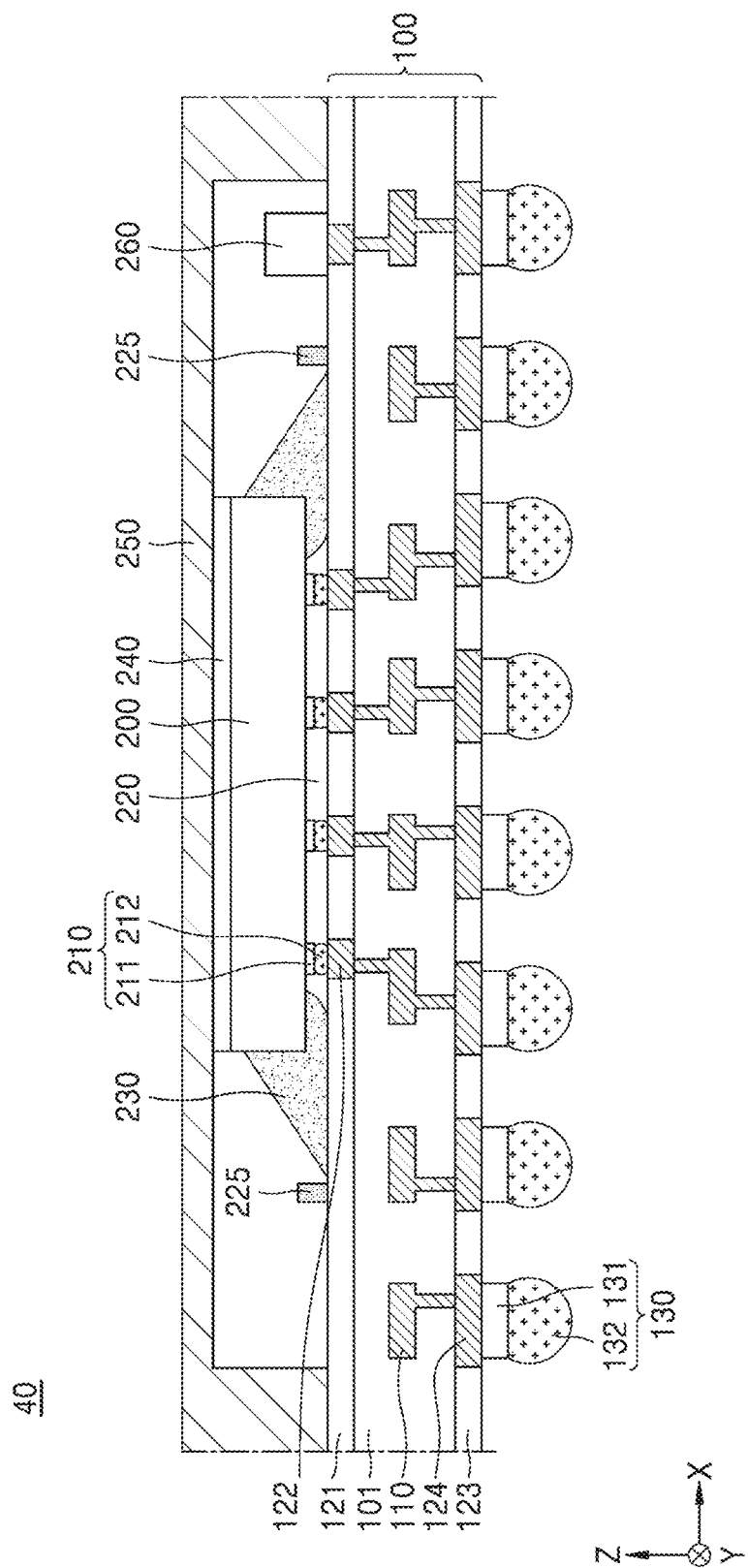
FIGS. 11 through 14 are schematic layout diagrams of semiconductor packages according to some example embodiments.

Referring to FIG. 11, unlike the semiconductor package 10 of FIGS. 1A through 1D, the semiconductor package 40 may include a length limiting member 225 and a passive element 260.

The length limiting member 225 may limit the distribution of the side encapsulation material 230 formed using an underfill process. According to some example embodiments, the length limiting member 225 may surround the semiconductor chip 200. In this case, the length limiting member 225 may limit a horizontal area (e.g., the X- and Y-direction lengths of the side encapsulation material 230) allocated to the semiconductor chip 200 in the semiconductor package 40, and therefore, the integration density of the semiconductor package 40 may be increased.

According to some example embodiments, the length limiting member 225 may include two bars that extend in the Y direction and are separated from each other in the X direction. In this case, only the X-direction length of the side encapsulation material 230 may be limited.

The passive element 260 may include, for example, a multilayer ceramic capacitor (MLCC). MLCC may block out external noise.

Figure 12:
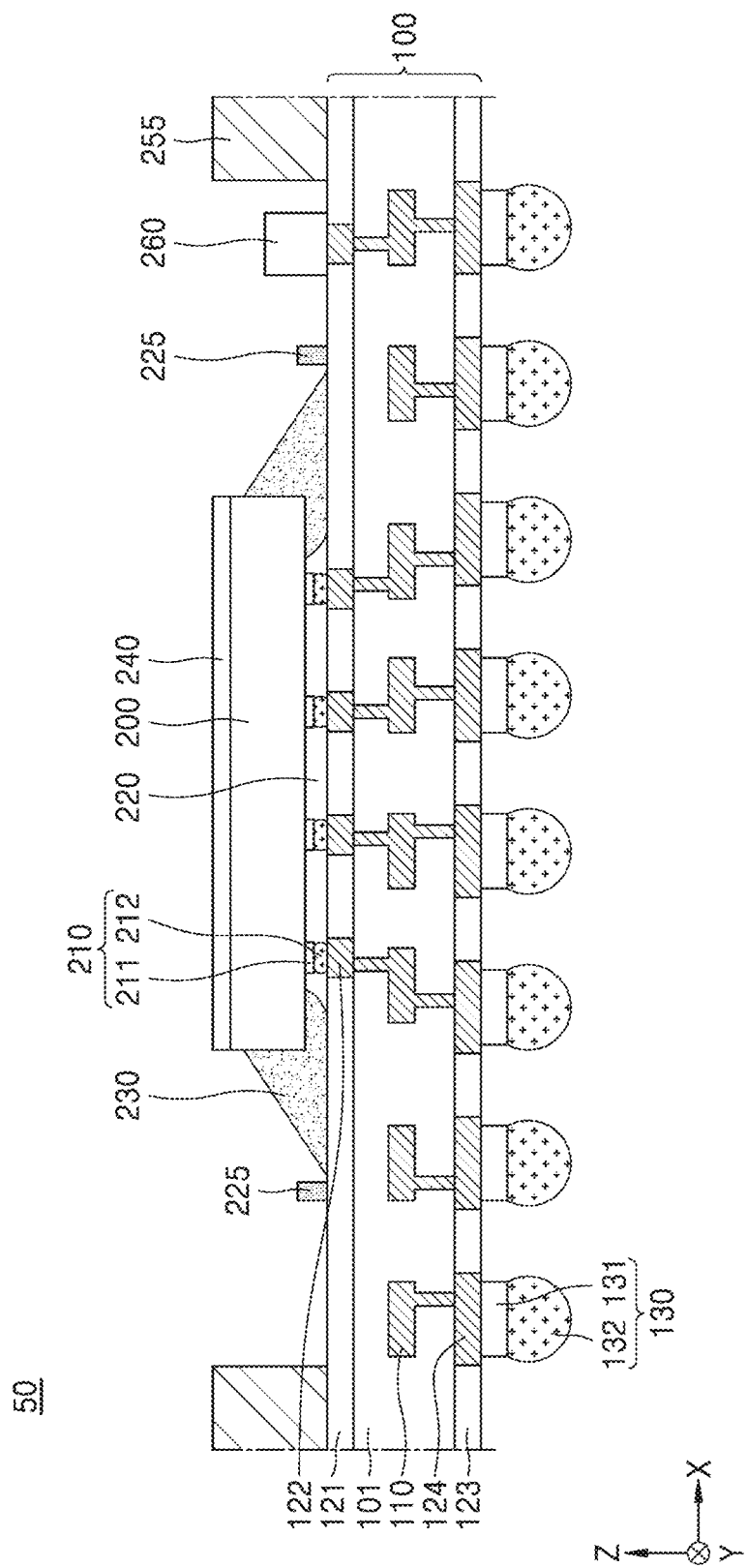

Referring to FIG. 12, unlike the semiconductor package 40 of FIG. 11, the semiconductor package 50 may not include the TIM layer 240 and the heat sink 250.

The semiconductor package 50 may include a stiffener 255 to enhance the mechanical strength of the package substrate 100 (e.g., a printed circuit board) and to protect the semiconductor chip 200.

Figure 13:
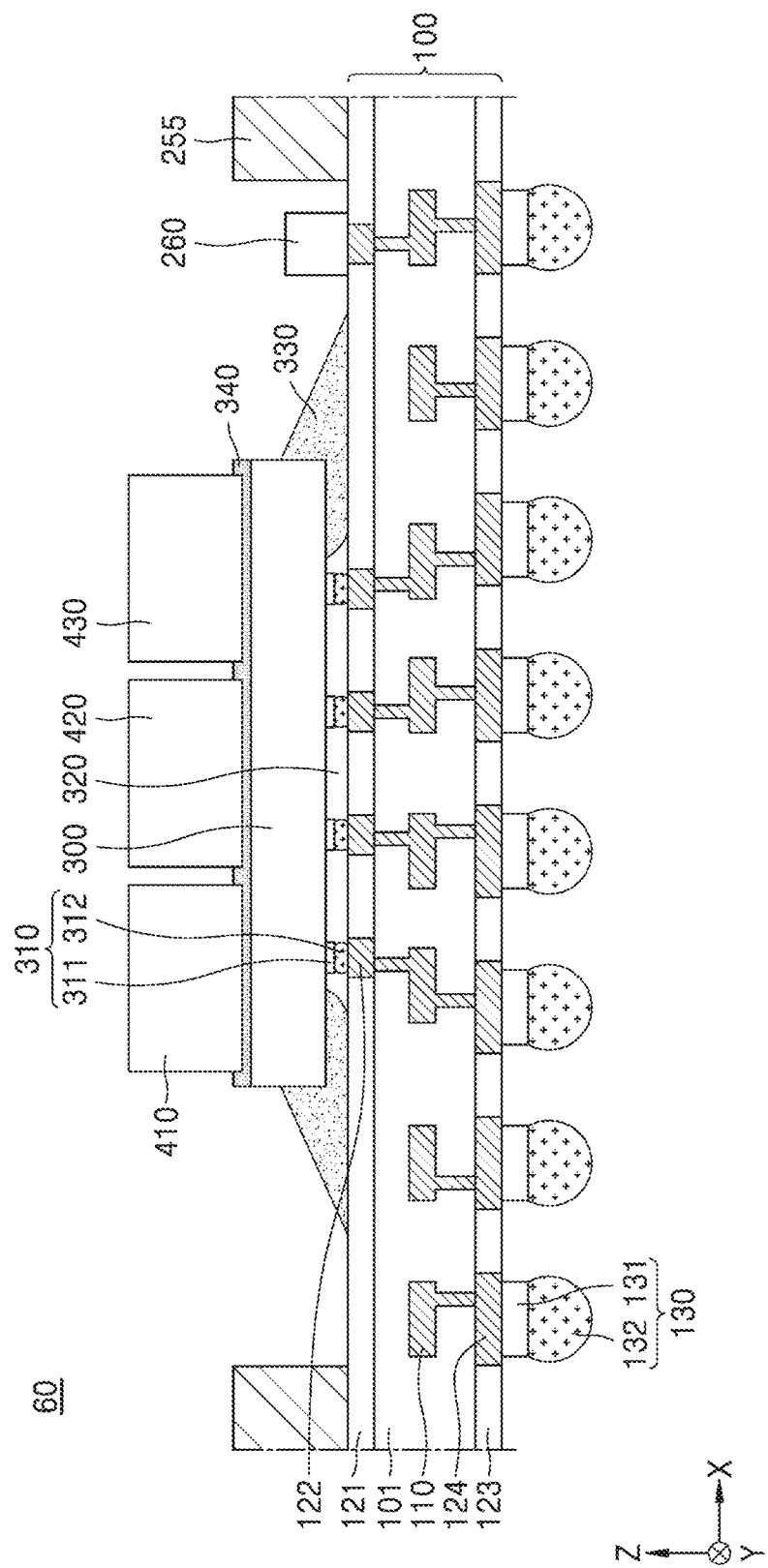

Referring to FIG. 13, the semiconductor package 60 may include the package substrate 100, an interposer substrate 300, and first through third semiconductor chips 410, 420, and 430. The semiconductor package 60 may further include the stiffener 255, the passive element 260, a connection terminal 310 including a UBM layer 311 and solder 312, an NCF 320, a side encapsulation material 330, and an adhesive film 340.

The interposer substrate 300 may include a substrate base including a semiconductor material, upper pads on a top surface of the substrate base, and lower pads on a bottom surface of the substrate base. For example, the substrate base may be formed from a silicon wafer. Internal wirings may be formed in the top and bottom surfaces and the inside of the substrate base. Further, a plurality of through vias electrically connecting the upper pads to the lower pads may be formed in the inside of the substrate base.

A plurality of connection terminals 310 may be arranged below the interposer substrate 300. The connection terminals 310 are the same as or substantially similar to the connection terminals 210 in FIG. 1B. The interposer substrate 300 may be electrically connected to the package substrate 100 through the connection terminals 310.

The NCF 320 and the side encapsulation material 330 are the same as or substantially similar to the NCF 220 and the side encapsulation material 230 in FIG. 1B, and thus detailed descriptions thereof will be omitted. According to some example embodiments, the interposer substrate 300 may be bonded to the package substrate 100 by the NCF 320 and the side encapsulation material 330. Accordingly, reliability of the semiconductor package 60 may be enhanced.

The first through third semiconductor chips 410, 420, and 430 may be fixed to the interposer substrate 300 by the adhesive film 340. The first through third semiconductor chips 410, 420, and 430 may include HBM including a DRAM chip, a graphics processing unit (GPU), ASIC, FPGA, CPU, or an RF chip but are not limited thereto. Although not shown, connection terminals may be between the interposer substrate 300 and the first through third semiconductor chips 410, 420, and 430. The first through third semiconductor chips 410, 420, and 430 may be electrically connected to internal wirings (e.g., through vias and upper and lower pads) of the interposer substrate 300 by the connection terminals.

Figure 14:
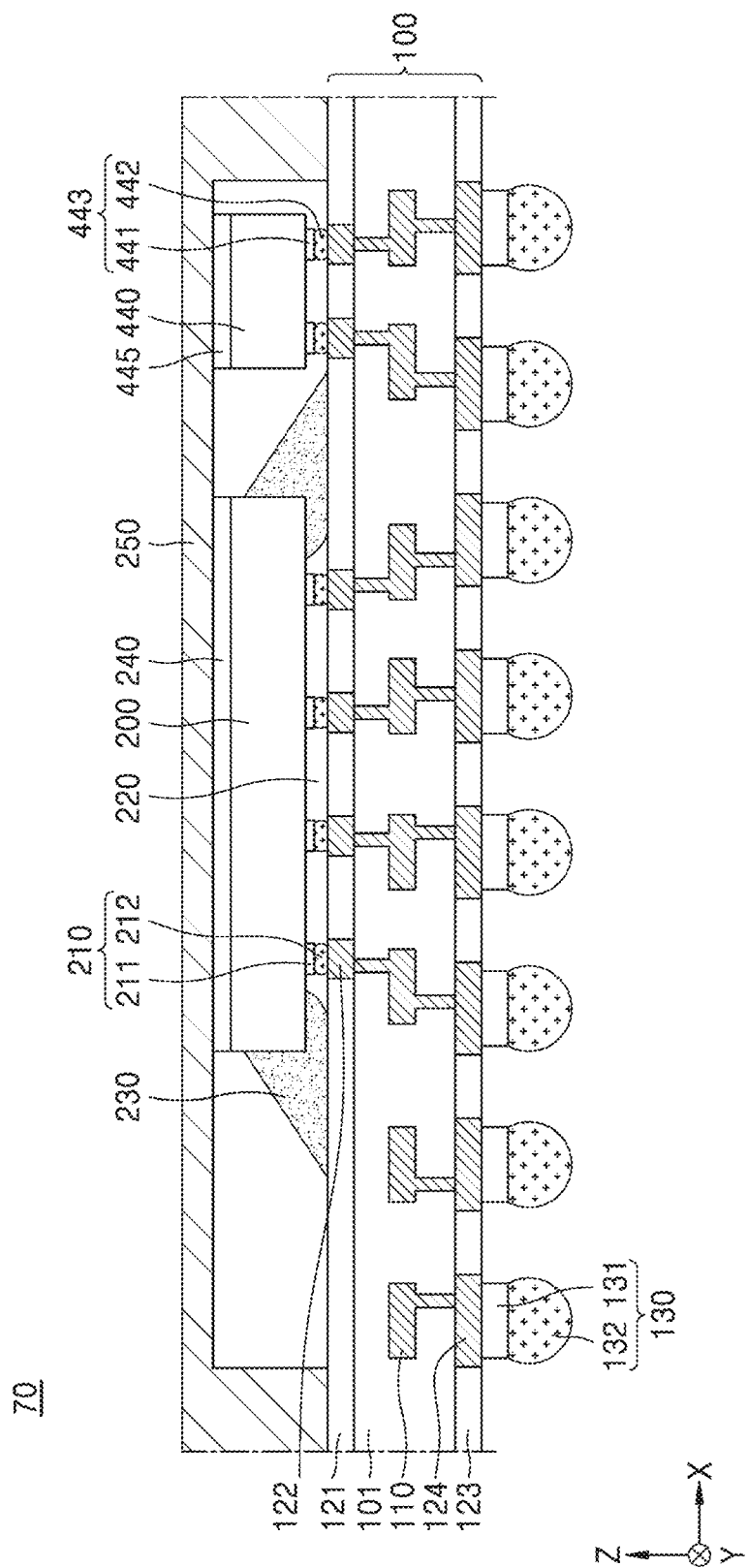

Referring to FIG. 14, the semiconductor package 70 may further include a fourth semiconductor chip 440 as compared to the semiconductor package 10 of FIGS. 1A through 1D. The fourth semiconductor chip 440 may be connected to the package substrate 100 through a connection terminal 443, which includes a UBM layer 441 and solder 442.

A TIM layer 445 may be arranged on a top surface of the fourth semiconductor chip 440 to form thermal contact with the heat sink 250. The TIM layer 445 may be the same as or substantially similar to the TIM layer 240.

The fourth semiconductor chip 440 may be relatively smaller than the semiconductor chip 200. Accordingly, the fourth semiconductor chip 440 may be connected to the package substrate 100 through a reflow process, and an NCF or a side encapsulation material may not be formed between the fourth semiconductor chip 440 and the package substrate 100.

Figure 15:
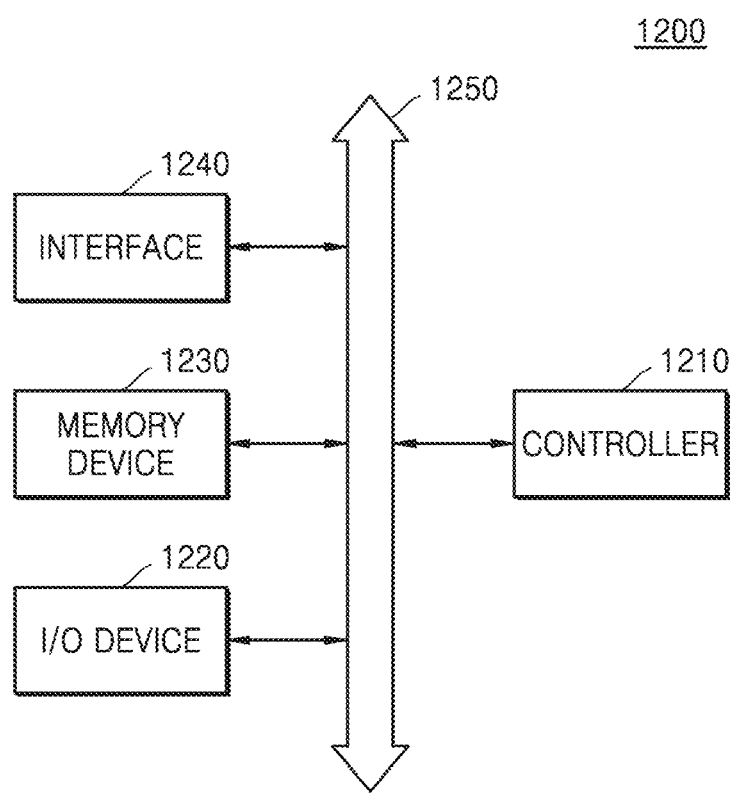
FIG. 15 is a schematic block diagram of a system including a semiconductor package, according to an example embodiment.

FIG. 15 is a schematic block diagram of a system 1200 including a semiconductor package, according to an example embodiment.

Referring to FIG. 15, the system 1200 includes a controller 1210, an I/O device 1220, a memory device 1230, and an interface 1240. According to some example embodiments, the system 1200 may include or be implemented by one of the semiconductor package 10 of FIGS. 1A through 1D, the semiconductor packages 10', 20, and 30 of FIGS. 2 through 4, and the semiconductor packages 40, 50, 60, and 70 of FIGS. 12 through 14.

The system 1200 may include a mobile system or a system that transmits or receives information. In some example embodiments, the mobile system may include a personal digital assistant (PDA), a portable computer, a web tablet, a wireless phone, a mobile phone, a digital music player, or a memory card.

The controller 1210 controls an executable program in the system 1200. The controller 1210 may include a microprocessor, a digital signal processor, a microcontroller, or the like.

The I/O device 1220 may input or output data of the system 1200. The system 1200 may be connected to and exchange data with an external device (e.g., a personal computer or a network) through the I/O device 1220. For example, the I/O device 1220 may include a keypad, a keyboard, or a display.

The memory device 1230 may store code and/or data used to operate the controller 1210 or store data processed by the controller 1210.

The interface 1240 may be a data transmission passage between the system 1200 and an external device. The controller 1210, the I/O device 1220, the memory device 1230, and the interface 1240 may communicate with one another through a bus 1250. The system 1200 may be included in a mobile phone, an MP3 player, a navigation device, a portable multimedia player (PMP), a solid state disk (SSD), or household appliances.

While the inventive concepts have been particularly shown and described with reference to some example embodiments thereof, it will be understood that various changes in form and details may be made therein without departing from the spirit and scope of the following claims.

What is claimed is:

1. A semiconductor package comprising:
   a package substrate;
   a semiconductor chip on a top surface of the package substrate;
   a connection terminal between the package substrate and the semiconductor chip, the connection terminal connecting the package substrate to the semiconductor chip;
   a non-conductive film (NCF) between the package substrate and the semiconductor chip, the NCF surrounding the connection terminal and bonding the semiconductor chip to the package substrate; and
   a side encapsulation material covering a side surface of the semiconductor chip, contacting the package substrate, and including a first portion interposed between a bottom surface of the semiconductor chip and the top surface of the package substrate,
   wherein the NCF includes a second portion that horizontally protrudes from the semiconductor chip when viewed from above, and the side encapsulation material is in contact with a portion of the bottom surface of the semiconductor chip.

2. The semiconductor package of claim 1, wherein the side encapsulation material has a different filler mass content than the NCF.

3. The semiconductor package of claim 2, wherein the side encapsulation material has a higher filler mass content than the NCF.

4. The semiconductor package of claim 2, wherein the side encapsulation material has a filler mass content between 40 wt % and 90 wt %.

5. The semiconductor package of claim 2, wherein the NCF has a filler mass content between 30 wt % and 60 wt %.

6. The semiconductor package of claim 1, wherein the NCF is transparent.

7. The semiconductor package of claim 1, wherein the side encapsulation material has a higher Young's modulus than the NCF.

8. The semiconductor package of claim 1, wherein the side encapsulation material includes liquid resin.

9. A semiconductor package comprising:
   a printed circuit board including a substrate base, a first pad on a top surface of the substrate base, a first resist layer covering the top surface of the substrate base and exposing at least a portion of the first pad, a second pad on a bottom surface of the substrate base, and a second resist layer covering the bottom surface of the substrate base and exposing at least a portion of the second pad;
   a semiconductor chip on the top surface of the printed circuit board, the semiconductor chip having a quadrangular shape from top view;
   a connection terminal between the printed circuit board and the semiconductor chip, the connection terminal including a first under bump metallurgy (UBM) layer contacting the first pad and a first solder contacting the first UBM layer;
   an external connection terminal including a second UBM layer contacting the second pad and a second solder contacting the second UBM layer, the external connection terminal being larger than the connection terminal;
   a non-conductive film (NCF) in only a portion of a space between the printed circuit board and the semiconductor chip, the NCF surrounding the connection terminal and bonding the printed circuit board to the semiconductor chip; and
   a side encapsulation material including a portion interposed between a bottom surface of the semiconductor chip and the top surface of the printed circuit board, the side encapsulation material covering a side surface of the semiconductor chip and contacting the printed circuit board.

10. The semiconductor package of claim 9, wherein the space between the printed circuit board and the semiconductor chip is completely filled with the NCF, the side encapsulation material, and the connection terminal.

11. The semiconductor package of claim 9, wherein a shape of the NCF from top view is different from the shape of the semiconductor chip from top view.

12. The semiconductor package of claim 9, wherein a contour line of the NCF from top view includes a curved line portion.

13. The semiconductor package of claim 9, wherein the NCF protrudes from the semiconductor chip in a lateral direction when viewed from above.

14. The semiconductor package of claim 9, wherein the NCF is not below a first corner corresponding to at least one of four corners of the quadrangular shape of the semiconductor chip.

15. The semiconductor package of claim 14, wherein the side encapsulation material is below the first corner.

16. The semiconductor package of claim 9, wherein a horizontal area of the semiconductor chip is at least 100 mm².

17. A semiconductor package comprising:
a package substrate;
a semiconductor chip on a top surface of the package substrate;
a non-conductive film (NCF) only between the package substrate and a portion of a bottom surface of the semiconductor chip, the NCF having a larger horizontal area than the semiconductor chip; and
a side encapsulation material along side surfaces of the semiconductor chip, the side encapsulation material covering the side surfaces of the semiconductor chip and contacting the top surface of the package substrate and the bottom surface of the semiconductor chip.

18. The semiconductor package of claim 17, wherein the NCF is not below at least one corner of the semiconductor chip.

19. The semiconductor package of claim 17, wherein the NCF is not extend beyond the semiconductor chip at a middle portion of a first side surface corresponding to one of the side surfaces of the semiconductor chip when viewed from plan view.

20. The semiconductor package of claim 17, wherein the NCF and the side encapsulation material together completely fill between the package substrate and the semiconductor chip.

* * * * *